United States Patent
Andou et al.

(10) Patent No.: US 6,400,026 B1
(45) Date of Patent: Jun. 4, 2002

(54) SEMICONDUCTOR DEVICE WITH THE COPPER CONTAINING ALUMINUM ALLOY BOND PAD ON AN ACTIVE REGION

(75) Inventors: Takayoshi Andou; Hitoshi Ninomiya; Kinya Ohtani, all of Tokyo (JP)

(73) Assignee: NEC Corporation, Tokyo (JP)

(*) Notice: Subject to any disclaimer, the term of this patent is extended or adjusted under 35 U.S.C. 154(b) by 30 days.

(21) Appl. No.: 09/604,125

(22) Filed: Jun. 26, 2000

(30) Foreign Application Priority Data

Jun. 24, 1999 (JP) .......................................... 11-177645

(51) Int. Cl.$^7$ .............................................. H01L 23/48
(52) U.S. Cl. ........................ 257/771; 257/740; 257/751; 257/765
(58) Field of Search ................................ 257/771, 765, 257/751, 740

(56) References Cited

U.S. PATENT DOCUMENTS

| 4,636,832 A | * | 1/1987 | Abe et al. |
| 4,977,440 A | * | 12/1990 | Stevens |
| 5,523,626 A | * | 6/1996 | Hayashi et al. |
| 5,719,448 A | * | 2/1998 | Ichikawa |
| 5,751,065 A | * | 5/1998 | Chittipeddi et al. |
| 5,942,800 A | * | 8/1999 | Yiu et al. |
| 6,114,231 A | * | 9/2000 | Chen et al. |

FOREIGN PATENT DOCUMENTS

| EP | 5-6915 | | 1/1993 |
| EP | 0 646 959 A1 | * | 4/1995 |
| JP | 3-41770 A | * | 2/1991 |
| JP | 3-283631 | | 12/1991 |
| JP | 5-175273 | | 7/1993 |
| JP | 6-314722 | | 11/1994 |
| JP | 10-12571 | | 1/1998 |
| JP | 2756826 | | 3/1998 |

* cited by examiner

Primary Examiner—John F. Niebling
Assistant Examiner—Stephen W. Smoot
(74) Attorney, Agent, or Firm—Young & Thompson

(57) ABSTRACT

In a semiconductor device, an active region is formed on a semiconductor substrate. An electrode layer is directly formed on the active region and serves as a bonding pad. The electrode layer is mainly formed by an Al alloy layer containing Cu.

13 Claims, 9 Drawing Sheets

SEMICONDUCTOR DEVICE WITH THE COPPER CONTAINING ALUMINUM ALLOY BOND PAD ON AN ACTIVE REGION

BACKGROUND OF THE INVENTION

This invention relates to a semiconductor device, and in particular, to a semiconductor device for producing a high output such as a power MOS transistor and an insulating gate bipolar transistor.

In a semiconductor device having a high output of the type as mentioned above, a plurality of unit devices, which are called cells and each of which has the same structure, are formed on a surface of a substrate in a matrix form. Further, an electrode common to all cells is formed thereon.

In a conventional method of taking out an electrode, the electrode on the cell is taken out and placed onto a bonding pad, on which the cell is not being formed, to connect the bonding pad with a bonding wire for connecting an external portion.

However, in the recent cases, the bonding pad is directly placed on a cell region so that the on-resistance as well as the size of a chip is much more reduced.

Referring to FIG. 1, description will be made about a power MOS transistor according to a first related art.

As illustrated in FIG. 1, a $n^-$ type epitaxial layer 2 is formed on a $n^+$ type silicon substrate 1, and a p-type base layer 6 doped with p-type impurity is formed on a surface of the $n^-$ type epitaxial layer 2.

Further, a trench 3 is opened so as to reach the $n^-$ type epitaxial layer 2 from the substrate surface. After a gate oxide film 4 due to a thermal oxidation process is formed for an internal surface of the trench 3, a gate electrode 5 formed by polysilicon is buried in the trench 3.

Further, a $n^+$ source region 7 is formed around the gate electrode 5. An interlayer film 8 is formed on the gate electrode 5 to insulate and separate the gate electrode 5.

Moreover, an Al electrode layer 13 serving as a source bonding pad is formed on the substrate such that the source region 7 is short-circuited by the base layer 6.

In the meantime, a drain electrode 11 is formed at a back surface of the substrate.

In such a MOS transistor, the drain electrode 11 is bonded on a die pad (not shown), and the Al electrode layer 13 is coupled to a source lead (not shown) by the use of an Au bonding wire 12. Alternatively, an Al bonding wire may be used in lieu of the Au bonding wire.

The semiconductor device having such an Al electrode layer (namely, a bonding pad) is, for example, disclosed in Japanese Unexamined Patent Publication No. Hei. 2-308539 (which is, Japanese Patent No. 2756826), Japanese Unexamined Patent Publication No. Hei. 5-175273, and Japanese Unexamined Patent Publication No. Hei. 10-12571.

Herein, a side which is brought into contact with a semiconductor substrate is made of Al including Si, while a wire-bonded side is made of Al as described in the above-mentioned Japanese Unexamined Patent Publication No. Hei. 2-308539.

Further, an Al underlayer is formed between gate electrodes so that a surface of an Al electrode layer is lowered on the gate electrode in the above Japanese Unexamined Patent Publication No. Hei. 5-175273.

In addition, an Al electrode having a silicon content of 0.1% or less is provided on a silicide layer as described in the above-mentioned Japanese Unexamined Patent Publication No. Hei. 10-12571.

However, in the electrode structure of this type, the Au Al alloy formed under the Au disadvantageously leads to the breakage of the transistor cell of the underlayer when the Au wire is bonded on the electrode layer. Consequently, this brings about the problem such as a leak, a short, or the like.

As illustrated in FIG. 2, the bonding process is carried out by applying pressure to the wire by a capillary under a heating process (this method is referred as to a thermo-compression bonding method).

Alternatively, the bonding process is performed by applying a supersonic vibration for the wire (this method is referred to as a supersonic thermo-compression bonding method).

When the bonding process is carried out, an $Au_4Al$ layer 14 is first formed at a contact surface between the wire and the Al electrode. Further, Au is further diffused from the $Au_4$ Al layer 14 into an internal portion. Thereby, an $Au_5 Al_2$ layer 15 is formed in an internal portion of the Al electrode.

As an alloy process proceeds, the interlayer film 8 is subjected to stress, and thereby, a crack 16 often occurs. In consequence, a breakdown voltage between the gate electrode 5 and the Al electrode layer 13 is degraded, and further, a short takes place.

Moreover, the surface of the silicon substrate is subjected to the stress by the alloy process during the bonding process, and thereby, a leak current is increased.

In addition, an alloy spike 17 is often generated by a reaction between the Al electrode layer 13 and the underlayer silicon directly under the bonding wire when the conventional semiconductor is kept at a high temperature between 150° C. and 175° C.

Under this circumstance, the alloy spike 17 often reaches the $n^-$ type epitaxial layer 2 through the p-type base layer 6. Consequently, the short-circuit accidentally occurs.

SUMMARY OF THE INVENTION

It is therefore an object of this invention to provide a semiconductor device which is capable of preventing an Al electrode layer being alloyed when an Au wire is bonded for an Al electrode layer on a cell in a semiconductor device having a high output, for example, a power MOS transistor.

It is another object of this invention to provide a semiconductor device which is capable of preventing growth of an alloy spike from an Al electrode under high temperature atmosphere.

According to this invention, a semiconductor device has a semiconductor substrate. An active region is formed on the semiconductor substrate. An electrode layer is directly formed on the active region and serves as a bonding pad.

With such a structure, the electrode layer is mainly formed by an Al alloy layer containing Cu.

In this event, the Al alloy layer is formed by an AlCu alloy or an AlSiCu alloy. The Al alloy layer preferably has a film thickness which is 2.5 μm or more.

Further, the Al alloy layer preferably has a Cu content which falls within the range between 0.1 and 5 weight %.

The electrode layer is formed by a laminate layer consisting of the Al alloy layer and a barrier layer. In this condition, the barrier layer is placed under the Al alloy layer.

In this case, the barrier layer is formed by a TiN/Ti layer or a TiN layer.

Alternatively, the barrier layer may be formed by a silicide layer having a high melting point.

The semiconductor device preferably produces a high output.

Such a semiconductor device includes a power MOS transistor or an insulating gate bipolar transistor.

More specifically, the bonding pad is formed on the cell transistor by the use of the Al alloy containing Cu. Consequently, the Al electrode can be effectively suppressed being alloyed into the Au—Al when the Au wire is bonded.

Thereby, the stress applied to the interlayer film during the wire bonding process can be suppressed. Further, the leak and short-circuit can be prevented. It is to be noted here that the leak and short-circuit are generated when the interlayer film is subjected to the damage.

Moreover, the barrier layer consisting of the TiN/Ti layer is formed under the Al electrode layer containing Cu. In consequence, the growth of the alloy spike can be suppressed even when the substrate is kept under the high temperature. As a result, the reliability can be enhanced for a long time.

DESCRIPTION OF PREFERRED EMBODIMENT

Figure 3:
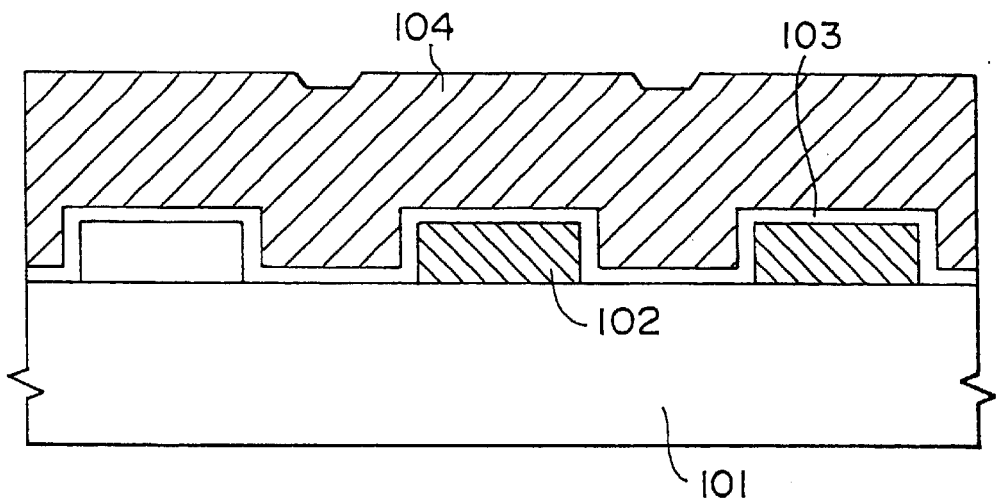
FIG. 3 is a cross sectional view showing a general embodiment of this invention.

Referring to FIG. 3, description will be made about a general embodiment of this invention.

As illustrated in FIG. 3, an interlayer film 102 consisting of an insulator is formed on a semiconductor substrate 101. Cell transistors (not shown) are regularly formed in a surface region of the semiconductor substrate 101.

Further, an electrode layer serving as a bonding pad is formed over the cell transistors. It is to be noted here that the electrode layer is formed by a double layer (namely, a stacked layer) consisting of a barrier layer 103 and an Al alloy layer 104 containing Cu.

In this event, a TiN layer, a TiN/Ti layer, a WSi layer, MoSi layer, and a TiSi layer may be used as the barrier layer 103. On the other hand, an AlCu alloy and AlSiCu alloy may be used as the Al alloy layer 104 contacting Cu. Herein, the Al alloy layer 104 is formed to a film thickness of 2.5 $\mu$m or more.

In this case, a Cu content of the Al alloy layer 104 preferably falls within the range between 0.1 and 5 weight %, and more preferably within the range between 0.2 and 3 weight %.

When the content is 0.1% or less, an effect for suppressing an alloy process becomes low. On the other hand, even when the content is 5% or more, it does not lead to the advantageous effect, however the film stress is inevitably increased.

In this invention, the film thickness of the Al electrode layer containing Cu is set to 2.5 $\mu$m or more. This reason will be explained below.

Figure 4:
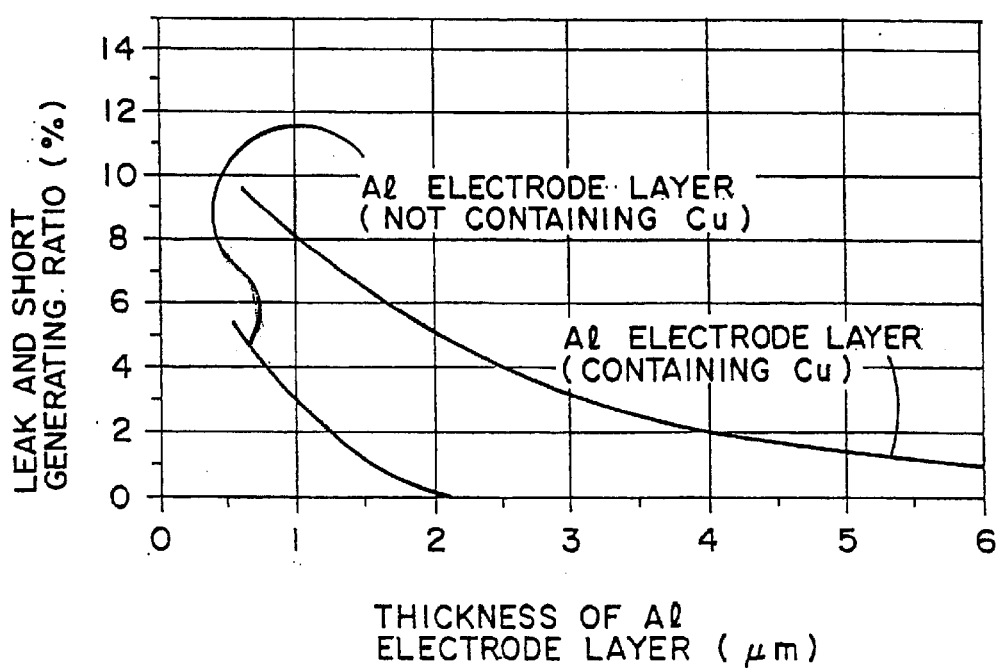
FIG. 4 is a graph showing an effect of this invention.

Namely, when the Al electrode layer has a film thickness larger than the current film thickness, generation of a leak and a short-circuit can be set to approximately zero % even when an Au bonding wire is used, as illustrated in FIG. 4. This fact is based upon the result of an experiment studied by inventors of the present invention.

(First Embodiment)

Figure 1:
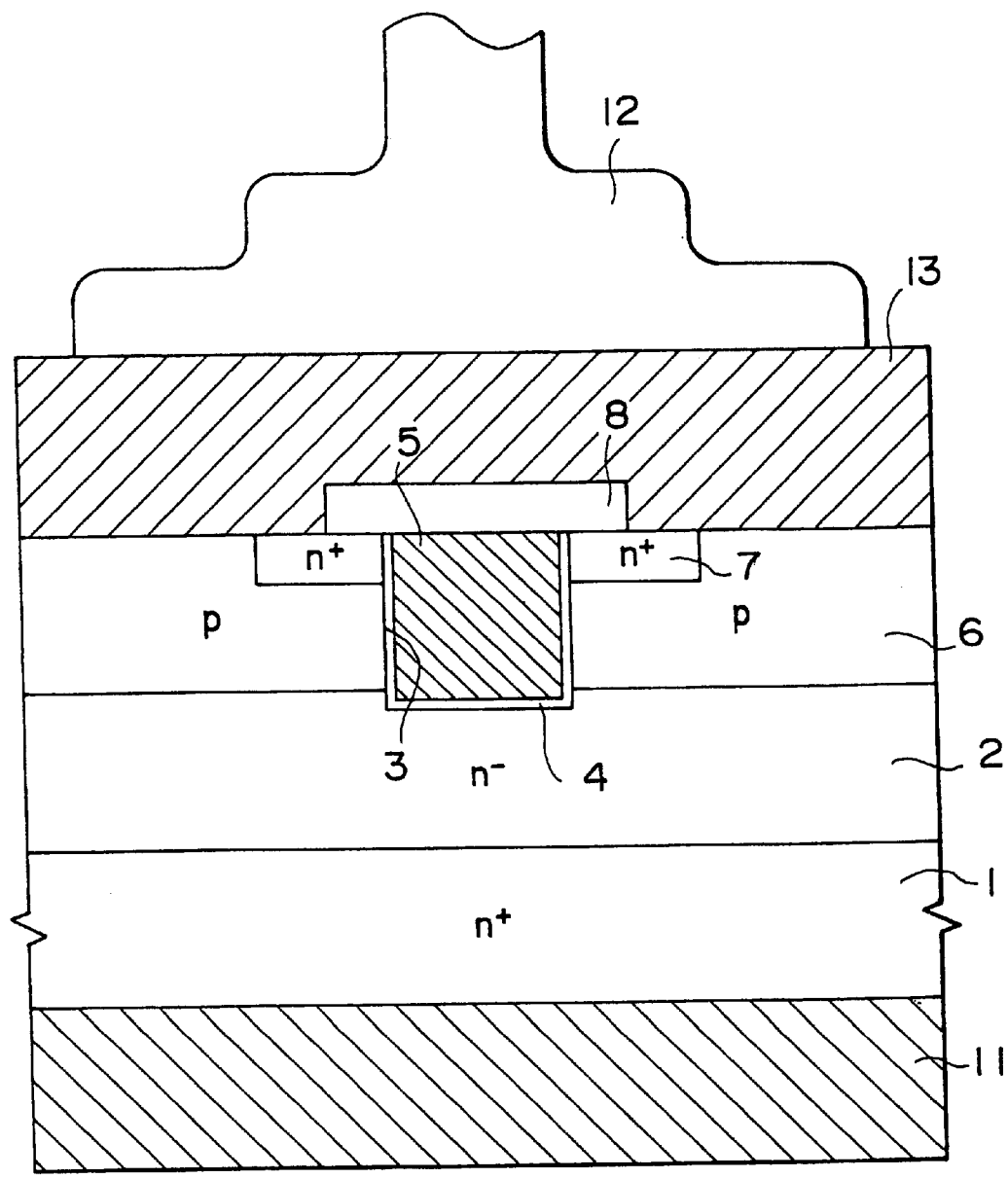
FIG. 1 is a cross sectional view showing a related power MOS transistor.
Figure 2:
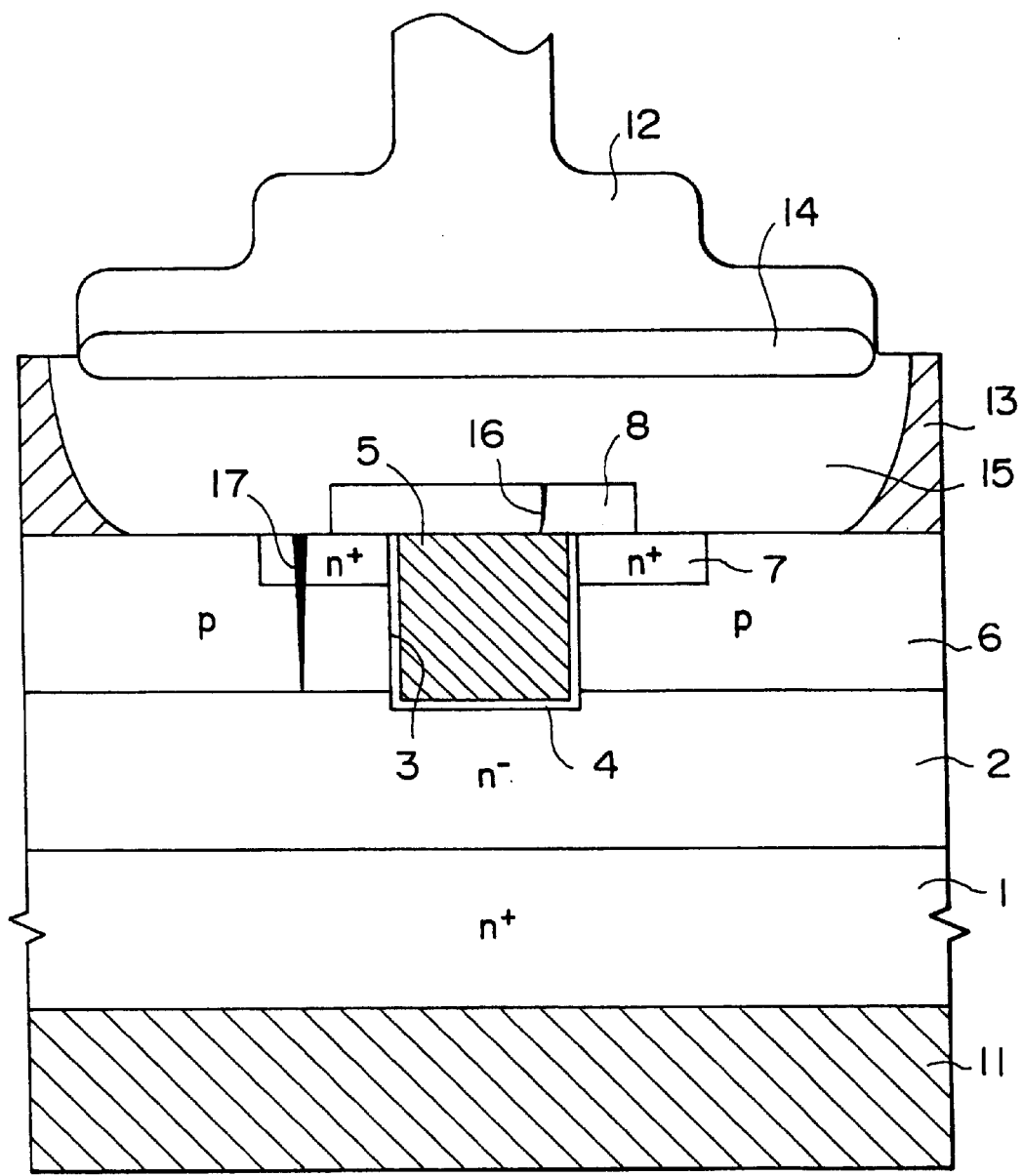
FIG. 2 is a cross sectional view for use in explaining problems of a related power MOS transistor.
Figure 5:
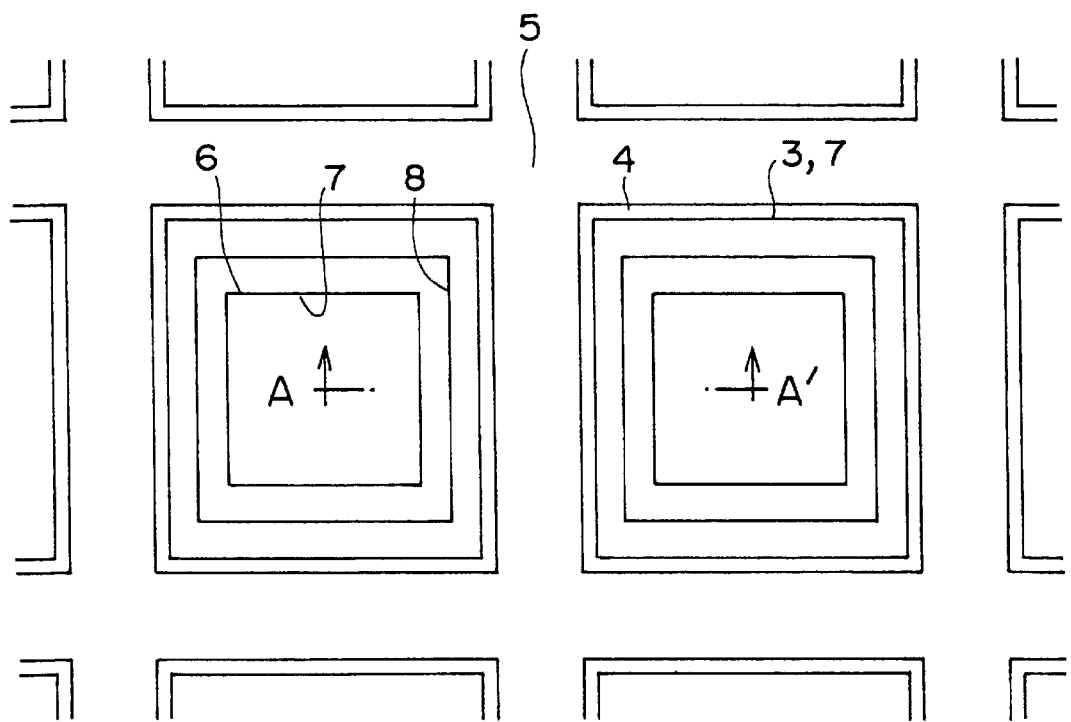
FIG. 5 is a plan view showing a first embodiment of this invention.
Figure 6:
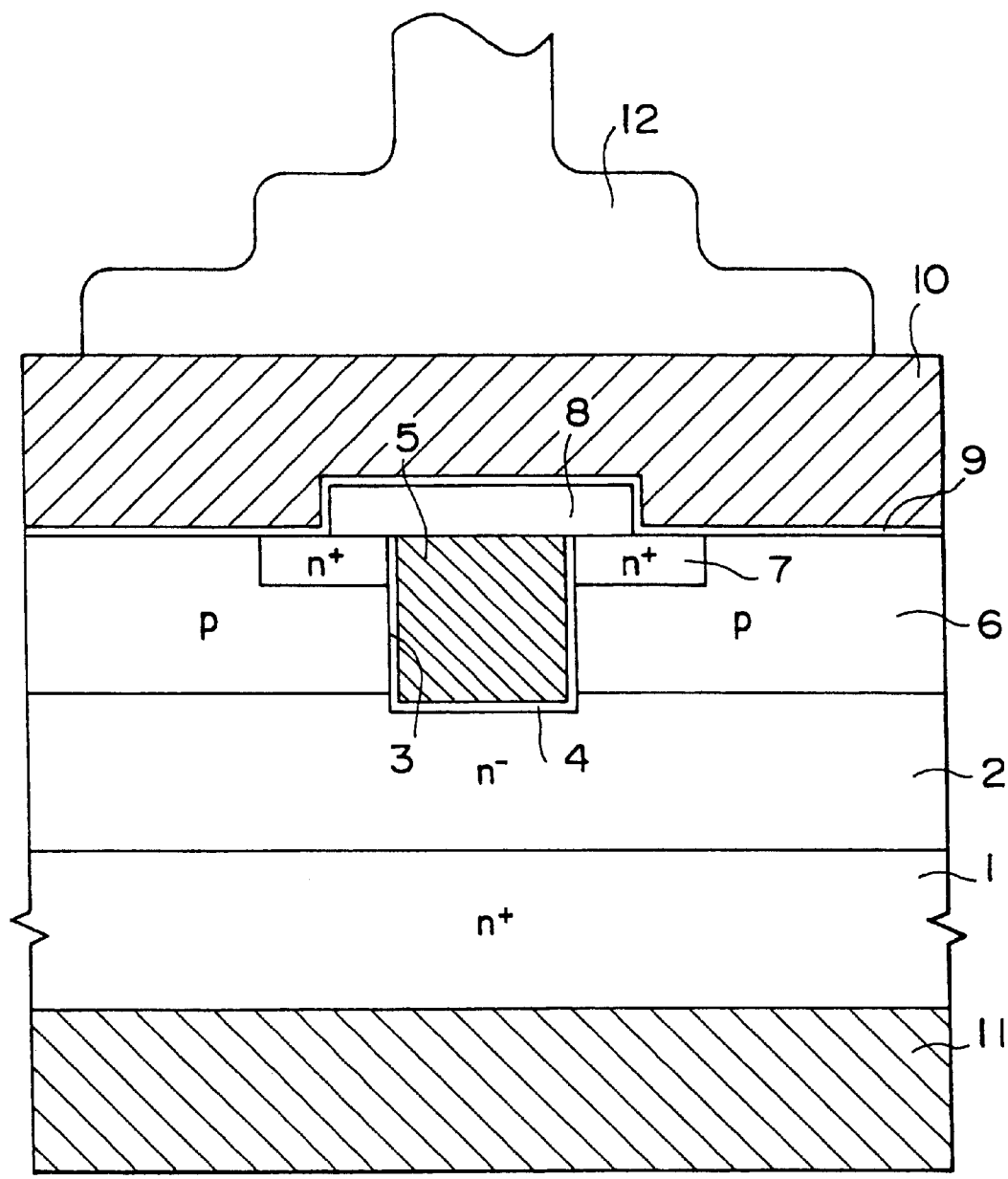
FIG. 6 is a cross sectional view showing a first embodiment of this invention, taken along A–A' line in FIG. 5.

Referring to FIGS. 5 and 6, description will be made about a first embodiment of this invention. Herein, the same reference numbers are given to the parts common to those of the related art illustrated in FIG. 1, and therefore, description thereof will be omitted hereinafter.

In the first embodiment, an entire surface of a silicon substrate and an interlayer film 8 is coated by a TiN/Ti layer 9 serving as a barrier layer, and an AlSiCu layer 10 is formed thereon.

With this structure, the AlSiCu layer 10 is connected to a source lead of a package via a bonding wire. In this event, even when an Au bonding wire 12 is used, the bonding pad is formed by an alloy layer containing Cu.

Consequently, Au is prevented from being diffused into the Al layer during a bonding process. Thereby, the Al layer is suppressed from being alloyed.

Further, the TiN/Ti layer 9 is formed under the AlSiCu layer 10. In consequence, the growth of alloy spike from the AlSiCu layer 10 is effectively prevented when the semiconductor device is kept at a high-temperature.

Subsequently, description will be made about a method of manufacturing the semiconductor device according to the first embodiment with reference to FIGS. 7 through 11.

Figure 7:
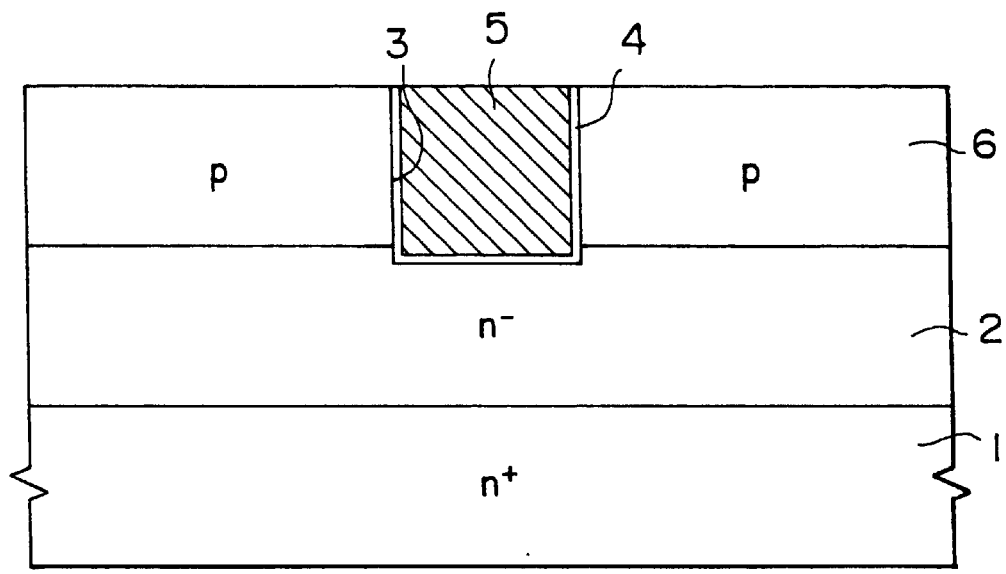
FIGS. 7 through 11 are cross sectional views explaining a method of manufacturing a semiconductor device according to a first embodiment.

First, the n⁻ type epitaxial layer 2 is formed on the n+ type silicon substrate, and the silicon oxide film (not show) is deposited to the film thickness of about 1 $\mu$m, as illustrated in FIG. 7.

Subsequently, a trench 3 is formed to have a depth of 1.0 $\mu$m and a width of 0.5 $\mu$m inside the silicon substrate by the use of the known photolithography method and the dry-etching method. It is to be noted here that the trench 3 passes in vertical and lateral directions on the substrate.

Successively, the gate oxide film 4 having the film thickness of 50 nm is formed at the internal surface of the trench 3 by the use of the thermal oxidation method.

Thereafter, the polysilicon is deposited on the entire surface, and the resistance of the polysilicon is reduced by diffusing phosphorus.

Next, the polysilicon and the silicon oxide film on the substrate are removed by the known etchback method or the known chemical mechanical polishing (CMP) method, and the polysilicon is buried in the trench to form the gate electrode 5.

Subsequently, boron (3) is ion-implanted on the condition of dose of 2E13 cm$^{-2}$ and acceleration energy of 70 KeV.

Thereafter, the resultant substrate is kept at the temperature of 1140° C. and for 10 minutes to form the p-type base layer 6, as illustrated in FIG. 7.

Figure 8:
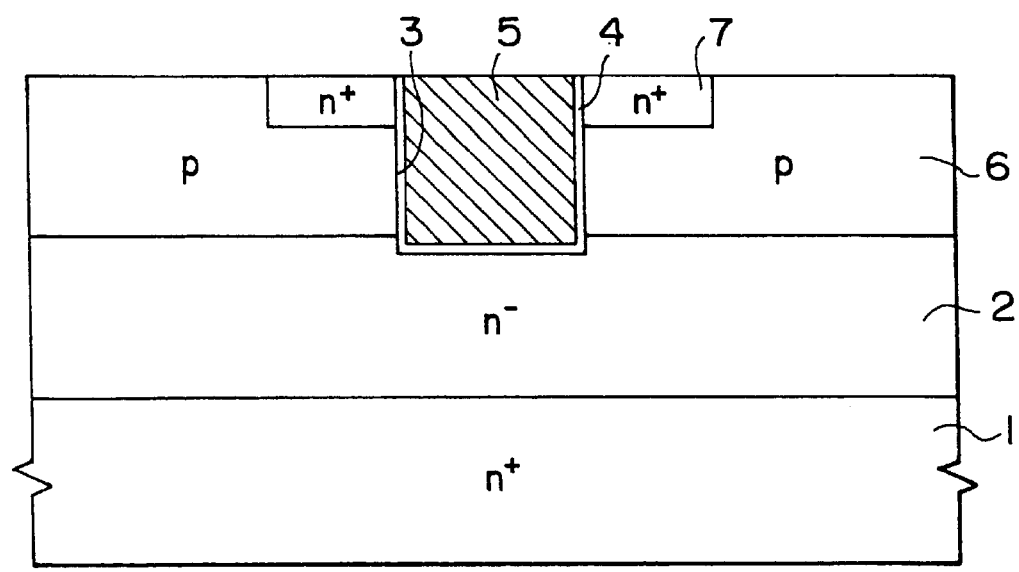

Successively, a mask is formed by the photolithography method. Thereafter, arsenic (As) is ion-implanted on the condition of dose of 1E16 cm$^{-2}$ and acceleration energy of 70 KeV, and the resultant substrate is kept at the temperature of 1000° C. and for 30 minutes to form the n⁺ type source region 7, as illustrated in FIG. 8.

Subsequently, the silicon oxide film is deposited to have a film thickness of about 1.0 $\mu$m by the use of the CVD method.

Figure 9:
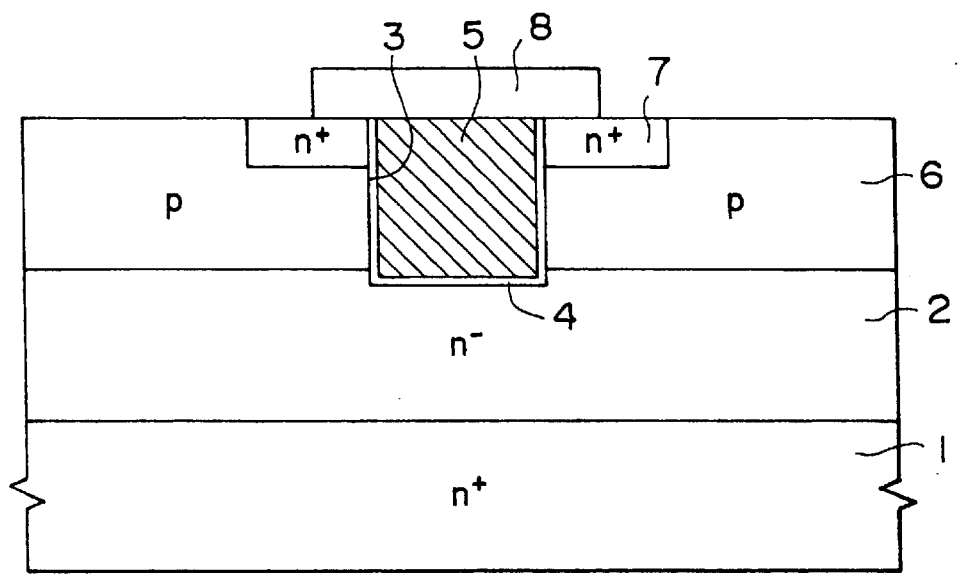

Thereafter, the silicon oxide film is patterned by the use of the photolithography method and the dry-etching method, and the interlayer film 8 is formed so as to coat the gate electrode 5. Herein, it is to be noted that the interlayer film 8 has a flat surface of a grating shape, as illustrated in FIG. 9.

Figure 10:
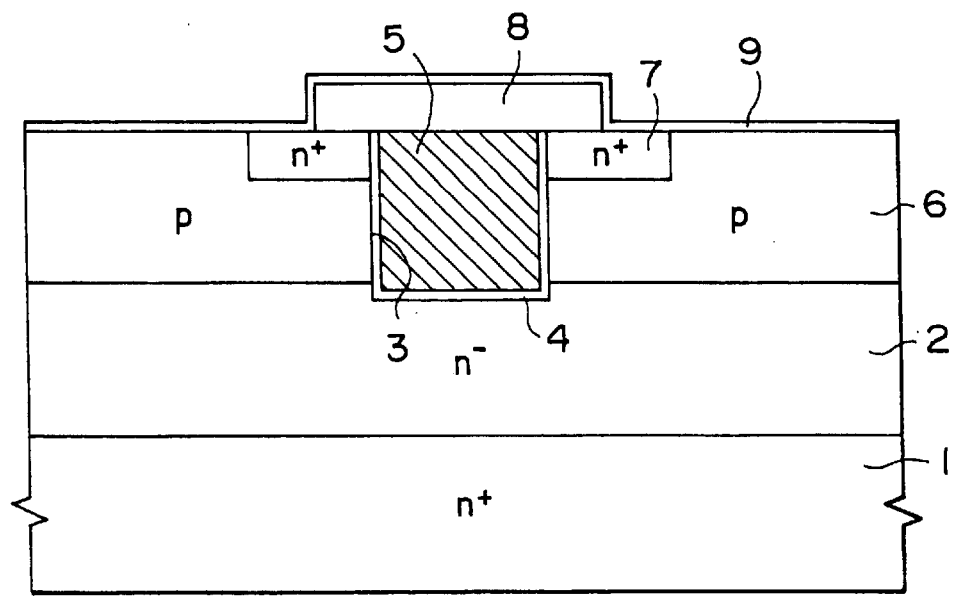

Subsequently, the TiN/Ti layer 9 (Ti:30 nm, TiN:100 nm) is deposited on the surface of the silicon substrate and the surface of the interlayer film 8, as illustrated in FIG. 10.

Thereafter, a lamp anneal is carried out at 670° C. and for 30 sec to relieve the stress of the TiN/Ti layer 9, as shown in FIG. 10.

Subsequently, the AlSiCu layer 10 is deposited to the film thickness of 4.5 $\mu$m by the use of the sputtering method for the entire surface. Further, the drain electrode 11 is formed at the back surface of the substrate by the use of the sputtering method.

Figure 11:
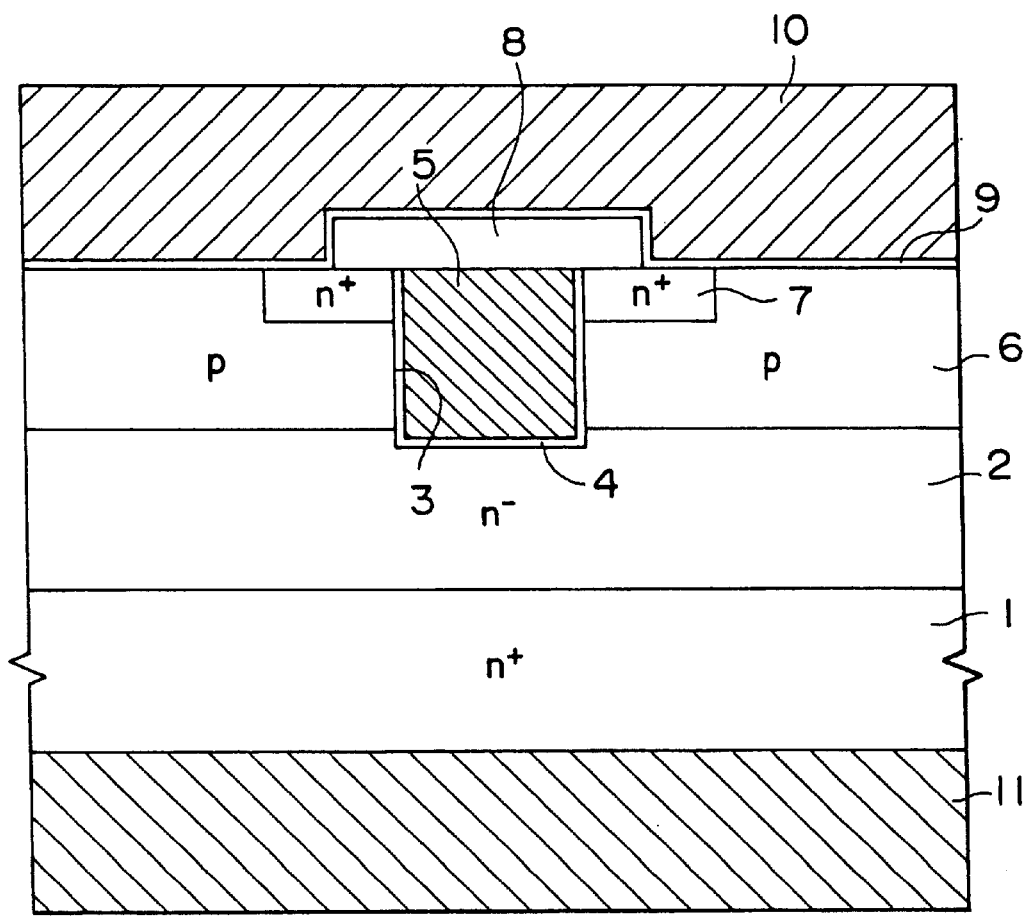

Successively, an anneal process is conducted at 450° C. and for 30 min to alloy, as illustrated in FIG. 11.

The thus formed MOS transistor is mounted on the die pad. Subsequently, the wire bonding process is performed, and the Au bonding wire 12 having a diameter of 70 $\mu$m is connected between the AlSiCu layer 10 serving as the source electrode and the source lead (not shown).

Thus, the semiconductor device illustrated in FIGS. 5 and 6 according to the first embodiment is completed.

(Second Embodiment)

Figure 12:
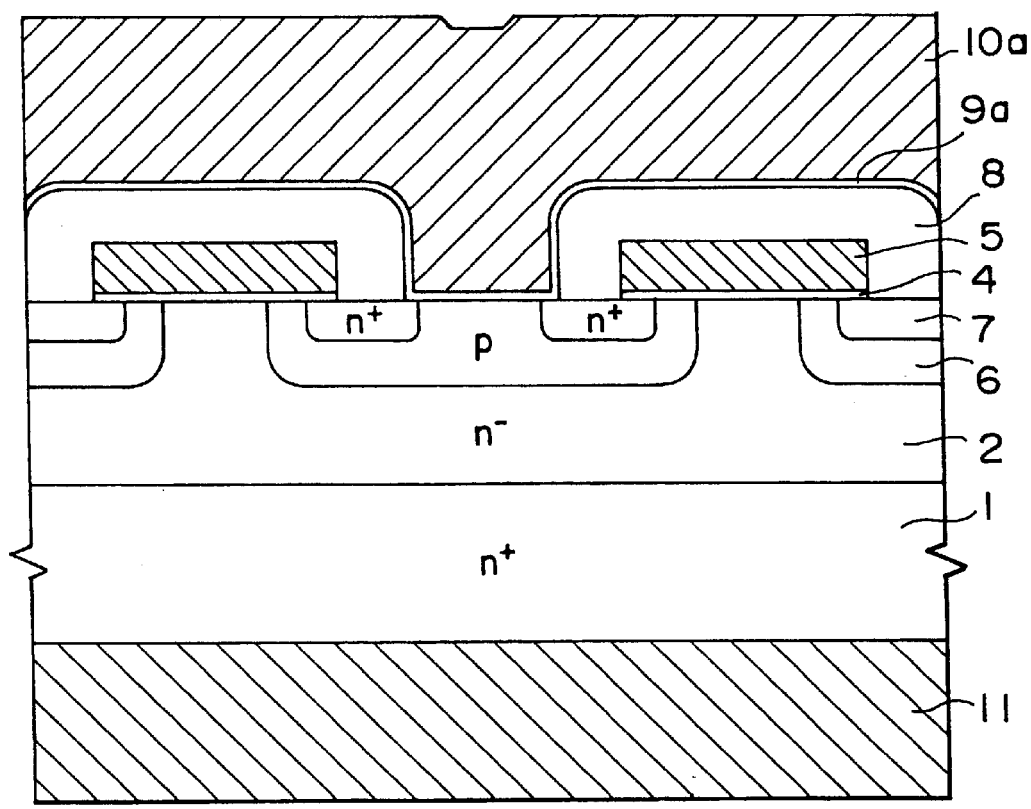
FIG. 12 is a plan view showing a second embodiment of this invention.

Referring to FIG. 12, description will be made about a second embodiment of this invention.

After the n⁻ type epitaxial layer 2 is formed on the n⁺ type silicon substrate 1, the gate oxide film 4 is formed to the film thickness of 50 nm by the use of the thermal oxidation process.

Further, the polysilicon is deposited to the film thickness of 0.5 $\mu$m for the entire surface, as shown in FIG. 12.

Next, the resistance of the polysilicon is reduced by diffusing phosphorus. The resultant polysilicon is patterned by the photolithography method and the dry-etching method. Thereby, the gate electrode 5 having the flat surface of the grating shape is formed.

Subsequently, boron is ion-implanted on the condition of dose of 2E13 cm⁻² and acceleration energy of 70 KeV. Thereafter, the resultant substrate is kept at the temperature of 1140° C. and for 10 minutes to form the p-type base layer 6.

Successively, a resist mask is formed at a center portion of an opening portion of the gate electrode by the photolithography method.

Thereafter, arsenic is ion-implanted on the condition of dose of 1E16 cm⁻² and acceleration energy of 70 KeV, and the resultant substrate is kept at the temperature of 1000° C. and for 30 minutes to form the n⁺ type source region 7, as illustrated in FIG. 12.

Subsequently, the silicon oxide film is deposited to the film thickness of about 0.8 $\mu$m for the entire surface.

Thereafter, the silicon oxide film is patterned by the use of the photolithography method and the dry-etching method, and the interlayer film 8 is formed so as to coat the gate electrode 5. Herein, it is to be noted that the interlayer film 8 has the flat surface of the grating shape.

Successively, the TiN layer 9a is deposited to the film thickness of 100 nm by the use of the known reactive sputtering method. Further, the AlCu layer 10a is deposited to the film thickness of about 4.5 $\mu$m by the use of the sputtering method thereon. Moreover, the drain electrode 11 is formed for the back surface of the substrate.

Thus formed power MOS transistor is mounted on the die pad (not shown), and the Au bonding wire is coupled between the AlCu layer 10a and the source lead.

While this invention has thus far been described in conjunction with several embodiments thereof, it will be readily possible for those skilled in the art to put this invention into practice in various other manners.

For example, although the source electrode (AlSiCu layer 10 and AlCu layer 10a) is connected to the source lead via the Au bonding wire in the above-mentioned embodiments, and it may be connected by an Al bonding wire instead of the Au bonding wire.

Further, although description has been made about the n-channel type transistor in the above embodiments, a p-channel MOS transistor may be applicable in this invention.

Moreover, this invention may be applicable for a power bipolar transistor (including an insulating gate bipolar transistor) in addition to the above-mentioned power MOS transistor.

What is claimed is:

1. A semiconductor transistor device having a semiconductor substrate and an attached bonding wire, comprising:

an active region which is formed on the semiconductor substrate;

a source electrode layer which is directly formed on the active region and which serves as a bonding pad with a contact area between a source bonding wire and the source electrode, the electrode layer comprising an Al alloy layer containing Cu; and a gate electrode disposed on the active region;

wherein the source bonding wire comprises gold; and wherein the gate electrode and the source bonding wire contact area are arranged so that a line extending perpendicularly from a surface of the semiconductor substrate through the gate electrode also passes through the source bonding wire contact area.

2. A device as claimed in claim 1, wherein:

the Al alloy layer is formed by an AlCu alloy or an AlSiCu alloy.

3. A device as claimed in claim 1, wherein:

the Al alloy layer has a film thickness which is 2.5 $\mu$m or more.

4. A device as claimed in claim 1, wherein:

the Al alloy layer has a Cu content which falls within the range between 0.1 and 5 weight %.

5. A device as claimed in claim 1, wherein:

the electrode layer is formed by a laminate layer consisting of the Al alloy layer and a barrier layer, and the barrier layer is placed under the Al alloy layer.

6. A device as claimed in claim 5, wherein:

the barrier layer is formed by a TiN/Ti layer.

7. A device as claimed in claim 5, wherein:

the barrier layer is formed by a TiN layer.

8. A device as claimed in claim 5, wherein:

the barrier layer is formed by a silicide layer having a high melting point.

9. A device as claimed in claim 1, wherein:

the semiconductor device produces a high output.

10. A device as claimed in claim 9, wherein:

the semiconductor device comprises a power MOS transistor.

11. A device as claimed in claim 9, wherein:

the semiconductor device comprises an insulating gate bipolar transistor.

12. The semiconductor transistor device of claim 1, wherein the source bonding wire contact area covers an entire width of the gate electrode.

13. The semiconductor transistor device of claim 1, further comprising a drain electrode disposed on a side of the semiconductor substrate opposite the gate electrode.

* * * * *